(12) United States Patent
Iyer et al.

(10) Patent No.: US 7,732,893 B2
(45) Date of Patent: Jun. 8, 2010

(54) ELECTRICAL FUSE STRUCTURE FOR HIGHER POST-PROGRAMMING RESISTANCE

(75) Inventors: Subramanian S. Iyer, Mount Kisco, NY (US); Deok-Kee Kim, Bedford Hills, NY (US); Chandrasekharan Kothandaraman, Hopewell Junction, NY (US); Byeongju Park, Plainview, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 11/683,071

(22) Filed: Mar. 7, 2007

(65) Prior Publication Data

US 2008/0217733 A1     Sep. 11, 2008

(51) Int. Cl.
*H01L 29/04* (2006.01)
*H01L 31/036* (2006.01)

(52) U.S. Cl. .......... 257/529; 257/530; 257/E23.147; 257/E23.149; 257/537; 257/538; 257/209

(58) Field of Classification Search ........ 257/529, 257/530, E23.147, E23.149, 537, 538, 209
See application file for complete search history.

(56) References Cited

U.S. PATENT DOCUMENTS

| | | | |
|---|---|---|---|
| 4,914,055 A | 4/1990 | Gordon et al. | |
| 5,272,666 A | 12/1993 | Tsang et al. | |
| 5,412,593 A | 5/1995 | Magel et al. | |
| 5,621,691 A | 4/1997 | Park | |
| 5,903,041 A | 5/1999 | La Fleur et al. | |
| 6,096,580 A | 8/2000 | Iyer et al. | |
| 6,323,534 B1 | 11/2001 | Marr et al. | |
| 6,346,846 B1 | 2/2002 | Bertin et al. | |
| 6,372,652 B1 * | 4/2002 | Verma et al. ............ 438/706 |
| 6,388,305 B1 | 5/2002 | Bertin et al. | |
| 6,396,120 B1 | 5/2002 | Bertin et al. | |
| 6,396,121 B1 | 5/2002 | Bertin et al. | |
| 6,433,404 B1 | 8/2002 | Iyer et al. | |
| 6,498,056 B1 | 12/2002 | Motsiff et al. | |
| 6,512,284 B2 | 1/2003 | Schulte et al. | |

(Continued)

FOREIGN PATENT DOCUMENTS

WO    WO 2004/100271 A1    11/2004

(Continued)

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

(Continued)

*Primary Examiner*—Jerome Jackson, Jr.
*Assistant Examiner*—David Z Chen
(74) *Attorney, Agent, or Firm*—Scully, Scott, Murphy & Presser, P.C.; Joseph P. Abate, Esq.

(57) ABSTRACT

The present invention provides an electrical fuse structure for achieving a post-programming resistance distribution with higher resistance values and to enhance the reliability of electrical fuse programming. A partly doped electrical fuse structure with undoped semiconductor material in the cathode combined with P-doped semiconductor material in the fuselink and anode is disclosed and the data supporting the superior performance of the disclosed electrical fuse is shown.

20 Claims, 9 Drawing Sheets

U.S. PATENT DOCUMENTS

| | | | |
|---|---|---|---|
| 6,570,207 | B2 | 5/2003 | Hsu et al. |
| 6,577,156 | B2 | 6/2003 | Anand et al. |
| 6,617,914 | B1 | 9/2003 | Kothandaraman |
| 6,621,324 | B2 | 9/2003 | Fifield et al. |
| 6,624,031 | B2 | 9/2003 | Abadeer et al. |
| 6,624,499 | B2 | 9/2003 | Kothandaraman et al. |
| 6,661,330 | B1 | 12/2003 | Young |
| 6,750,530 | B1 | 6/2004 | Klaasen et al. |
| 6,751,137 | B2 | 6/2004 | Park et al. |
| 6,753,590 | B2 | 6/2004 | Fifield et al. |
| 6,794,726 | B2 | 9/2004 | Radens et al. |
| 6,853,049 | B2 | 2/2005 | Herner |
| 6,879,021 | B1 | 4/2005 | Fitfield et al. |
| 6,882,027 | B2 | 4/2005 | Brintzinger et al. |
| 6,927,997 | B2 | 8/2005 | Lee et al. |
| 6,944,054 | B2 | 9/2005 | Rueckes et al. |
| 6,972,614 | B2 | 12/2005 | Anderson, II et al. |
| 7,087,499 | B2 | 8/2006 | Rankin et al. |
| 2004/0004268 | A1 | 1/2004 | Brown et al. |
| 2004/0222491 | A1* | 11/2004 | Ito et al. .................. 257/529 |
| 2005/0247997 | A1 | 11/2005 | Chung et al. |
| 2005/0277232 | A1* | 12/2005 | Wu et al. .................. 438/132 |
| 2006/0102982 | A1 | 5/2006 | Park et al. |
| 2006/0278932 | A1 | 12/2006 | Kothandaraman et al. |
| 2007/0252237 | A1* | 11/2007 | Ko et al. .................. 257/529 |
| 2008/0157201 | A1* | 7/2008 | Marshall .................. 257/350 |

FOREIGN PATENT DOCUMENTS

WO    WO 2006/028946 A2    3/2006

OTHER PUBLICATIONS

U.S. Appl. No. 11/307,785, entitled, "System and Method for Increasing Reliability of Electrical Fuse Programming", filed Feb. 22, 2006, to Byeongju Park et al.

U.S. Appl. No. 11/462,070, entitled, "Anti-Fuse Structure Optionally Integrated With Guard Ring Structure", filed Aug. 3, 2006, to James W. Adkisson et al.

U.S. Appl. No. 11/366,879, entitled, "Programmable Anti-Fuse Structures, Methods for Fabricating Programmable Anti-Fuse Structures, and Methods of Programming Anti-Fuse Structures", filed Mar. 2, 2006, to Louis C. Hsu.

U.S. Appl. No. 11/161,320, entitled, "Doped Single Crystal Silicon Silicided eFuse", filed Jul. 29, 2005, to William R. Tonti et al.

U.S. Appl. No. 11/266,740, entitled, "eFuse and Methods of Manufacturing the Same", filed Nov. 3, 2005, to William R. Tonti et al.

* cited by examiner

ELECTRICAL FUSE STRUCTURE FOR HIGHER POST-PROGRAMMING RESISTANCE

FIELD OF THE INVENTION

The present invention relates to semiconductor devices, and particularly, to a programmable semiconductor fuse.

BACKGROUND OF THE INVENTION

Electrically programmable semiconductor fuses, or electrical fuses in short as it is referred to in this invention, have been used in semiconductor circuits to provide alterations in the functionality of the circuitry. Typical examples of applications of electrical fuses include: providing redundancy to enable repairs of imperfect chips, storage of secure and permanent information, selection of a particular configuration for chip operation, tuning analogue circuit components, optimizing overall circuit performance, and/or replacing defective circuit elements with redundant circuit elements.

Electrical fuses are programmed by the physical alteration of the structure of the electrical fuses. The most commonly used structure of electrical fuses employs a vertical stack comprising a semiconducting material and a conducting material. While the most common material for the vertical stack is polysilicon and silicide, other semiconducting materials and other conducting materials may be utilized if similar electromigration properties can be found in the combined stack of the two materials. This stack is patterned such that a narrow and long piece of material, called "fuselink" or "fuse neck," is adjoined by two large plates, called "cathode" and "anode" respectively, depending on the polarity of electrical bias applied to the electrical fuse during the programming. Electrical current of relatively high density flows through the fuselink when a sufficiently high voltage bias is applied across the cathode and the anode. The programming current may be high enough to cause the electrical fuses to rupture by a sudden increase in temperature in the physical structure of the electrical fuses. This type of programming is commonly referred to as "rupture mode programming." Alternatively, the level of the programming current may be moderated to cause a controlled electromigration of the material inside the electrical fuse structure. This alternative mode of programming is commonly referred to as "electromigration mode programming." Both types of programming method raise the resistance of the programmed fuse compared to that of intact fuses.

By measuring the resistance of electrical fuses, it can be determined whether the electrical fuse has been programmed or intact. While it may not be necessary to measure the exact value of the fuse resistance to determine the state of the fuse, it is generally necessary to determine whether the fuse resistance has been raised by a significant amount above the detection limit of the sensing circuitry. Typically, this is done by setting the resistance for a reference resistor at a value about 3~10 times that of an intact electrical fuse and comparing the resistance of the fuse with that of the reference resistor. A difference between the resistance of the reference resistor and the resistance of an intact fuse is often necessary to insure margin in the functionality of the sensing circuitry under adverse operating conditions of the chip.

Rupture mode programming in general tends to produce a distribution of programmed electrical fuse resistance with a significant fraction of low resistance values. Considering that millions of electrical fuses are often used in an array of electrical fuse memory, a failure rate even at a parts per million (ppm) level could be a reliability issue. Electromigration mode programming tends to generate less of the low resistance tails, and hence, better reliability in general. An example of the performance of P-doped electrical fuses in the electromigration mode can be found in Kothandaraman et al., "Electrically Programmable Fuse (eFUSE) Using Electromigration in Silicides," IEEE Electron Dev. Lett. Vol. 23, No. 9, September 2002, pp. 523-525. Kothandaraman et al. describes an electrically programmable P-doped fuse with P-doped polysilicon in the cathode, fuselink, and anode.

Despite the general improvement in the distribution of post-programming resistance of electrical fuses through the use of electromigration mode programming, not all fuses produce a post-programming resistance distribution with high resistance values even in an electromigration mode. The distribution of the resistance of programmed fuses is also dependent on the design of fuses as well; some producing more low resistance values for programmed fuses, while some others produce less low resistance values. Of critical importance among the features of the design is the doping of each component of the electrical fuse, i.e., the cathode, the fuselink, and the anode.

Since the sense circuitry interprets any fuse with resistance less than that of the resistance of the reference resistor as an intact, any programmed fuse with its resistance lower than that of the reference resistor is erroneously sensed as an intact fuse during a sense operation. An improved electrical fuse structure that produces a post-programming fuse resistance distribution with less of a low resistance portion is therefore desired to reduce the error rate in electrical fuse programming and thus to increase its reliability of electrical fuse programming.

The critical impact of the doping on the electrical fuse programming has been recognized in the industry and the prior art demonstrates attempts to improve the post-programming resistance of electrical fuses by modifying the structure of electrical fuses through doping. The use of undoped polysilicon or N+ doped polysilicon for all of the cathode, fuselink, and anode have been suggested and tested in the semiconductor industry. The doping of the polysilicon is the same across the cathode, fuselink, and anode in these prior arts.

More recently, U.S. Pat. No. 6,770,948 to Ito et al. discloses electrical fuses with different doping within a "fuse neck" (which approximately corresponds to the fuselink 120 in FIG. 1A and FIG. 1B) for achieving improved post-programming fuse resistance distribution. Among the structures disclosed by Ito et al. include a fuse neck with a P-type doped region and an N-type doped region; P-type doped region, undoped region, and N-type doped region; P-type doped region, region with both P-type and N-type doping, and N-type doped region. According to Ito et al., all interfaces between materials with different doping are confined within the "fuse neck".

Despite the improvements in the post-programming fuse resistance distribution, reliable programming of electrical fuses still faces challenges as the fuse dimensions shrink and the supply voltage for fuse programming decreases in succeeding semiconductor technology generations. Also, the problem of the statistical occurrence of fuses with low post-programming fuse resistance has been exacerbated by the recent trend in the microelectronics industry that requires reliable programming even under non-ideal programming conditions.

For example, the electrical fuse programming has been performed mostly on a tester before packaging of a chip in an environment where a stable voltage supply is available. The advent of autonomic computing, in which an operating computer can detect defects among its components and repair them during the operation, has created a demand for programming of the electrical fuses under adverse environment, in which the supply voltages may not be as stable as on a tester or the ambient conditions may not be optimal for electrical fuse programming.

Similarly, increased use in hand held devices where the power source is often a battery with a wide range of voltage variations as well as a source of a limited amount of current during the operation has created a demand for electrical fuse programming under adverse environment. Under this type of environment, the distribution of post-programming resistance tends to produce even more low resistance values.

It is therefore highly desirable to improve the design of the electrical fuses to produce a post-programming resistance distribution with less frequency of occurrence of fuses with low post-programming resistance and thus, to provide low programming failure rate. It is also desirable to provide an electrical fuse structure that can produce a distribution of high post-programming resistance even for smaller dimensions.

SUMMARY OF THE INVENTION

The present invention provides an electrical fuse structure that produces reduced frequency of occurrence of programmed fuses with low post-programming resistance.

Moreover this invention provides an electrical fuse structure that programs with improved reliability under non-ideal programming conditions and over wide variations in the manufacturing process.

While this disclosure uses polysilicon and silicide to describe the invention since they are the most common materials used for the semiconducting layer and the conducting layer, it should be recognized that there are similar semiconductor materials, such as amorphous silicon, epitaxial or single crystal silicon, silicon germanium alloy, silicon carbon alloy, and silicon carbon germanium alloy that may be used in a doped or undoped state. Similarly, other conducting materials such as a metal, a metal germanide, and a conducting metal nitride are conductors that exhibit electromigration behavior when sufficient electrical current is supplied. Therefore, this disclosure should be interpreted to include other semiconductor materials that may be used both in their doped and undoped state as well as other conducting materials that exhibit electromigration behavior.

According to this invention, a partly doped electrical fuse containing undoped polysilicon in the cathode and P-doped polysilicon in the fuselink and anode is disclosed. The cathode of the partly doped electrical fuse according to this invention comprises a stack of undoped polysilicon and a silicide. Each of the fuselink and the anode of the partly doped electrical fuse according to this invention has a stack of P-doped polysilicon and a silicide. Accordingly, an interface between an undoped polysilicon and P-doped polysilicon exists only at the boundary between the cathode and fuselink.

Superior performance of the partly doped electrical fuses according to this invention, that is, the reduction in frequency in the generation of programmed fuses with low post-programming resistance, is not a priori predictable. Understanding of the mechanism of electrical fuse programming is currently not at a level to be able to predict an optimal structure either in terms of geometry or doping of the various elements of the electrical fuses. The data establishing any better performance of one type of electrical fuse over others needs to be verified by experiments.

One example of the lack of predictability of electrical fuse performance is demonstrated by the comparison of the data for transient voltage and current responses during the programming of an undoped electrical fuse and a P-doped electrical fuse according to Kothandaraman et al. In this test, each electrical fuse is connected in series with a programming transistor. The transistor is grounded and the electrical fuse is connected to a positive voltage supply. The gate of the programming transistor is pulsed for a set period of time and the time response of the current through the circuit and the voltage is captured.

The examination of the transient response characteristics of electrical fuses show substantial differences that the prevailing theory on electromigration is not yet capable of predicting or explaining satisfactorily. With the current level of understanding of mechanism for electrical fuse programming, the performance of a particular electrical fuse structure requires experimental verification.

To effect the verification of an improvement in performance of the partly doped electrical fuses according to this invention over the prior art, three other types of fuse structures according to the prior art have also been manufactured on the same semiconductor wafers as well as the partly doped electrical fuses according to this invention.

Only the doping on various portions of the electrical fuse components was varied among the four types. The first type employed P-doped polysilicon across the cathode, fuselink, and anode. The second type employed undoped polysilicon across the cathode, fuselink, and anode. The third type employed undoped polysilicon in the cathode while employing P-doped polysilicon in the fuselink and the anode according to this invention. The fourth type employed N-doped polysilicon across the cathode, fuselink, and anode.

These four types of fuses were manufactured in volume and test data on these were compared. To ascertain that the fuses of the third type are superior over wide variations in the manufacture process, over 15,000 fuses of each type were tested and the data from them were compared.

Detailed analysis of the data thus collected shows that the partly doped electrical fuse according to this invention has indeed superior post-programming resistance distribution over the fuses known in the prior art.

DETAILED DESCRIPTION OF THE INVENTION

Before describing the present invention in detail, a general description of prior art electrical fuses is provided. This discussion is made here to clearly illustrate the fundamental difference between the prior art and the present invention.

Figure 1A:
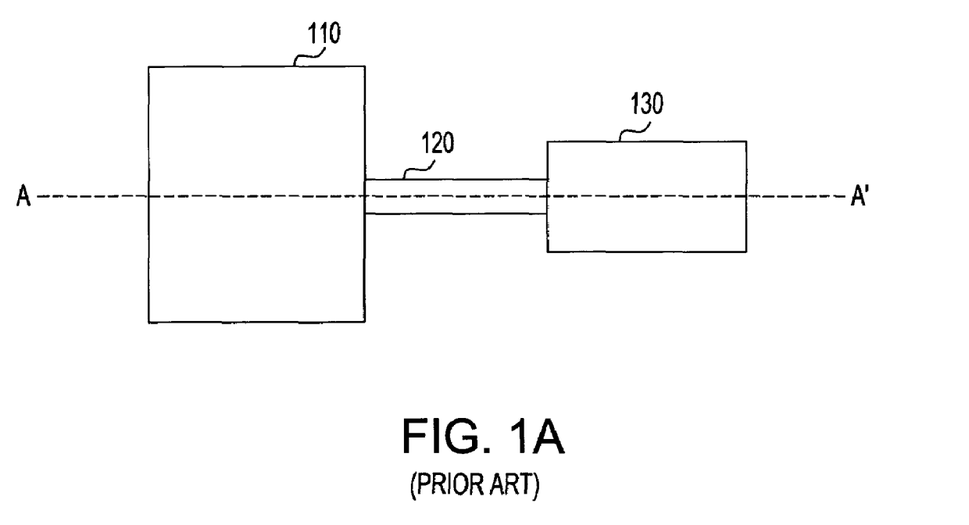
FIG. 1A is a view diagram of an electrically programmable P-doped fuse 100 as disclosed in Kothandaraman et al.
Figure 1B:
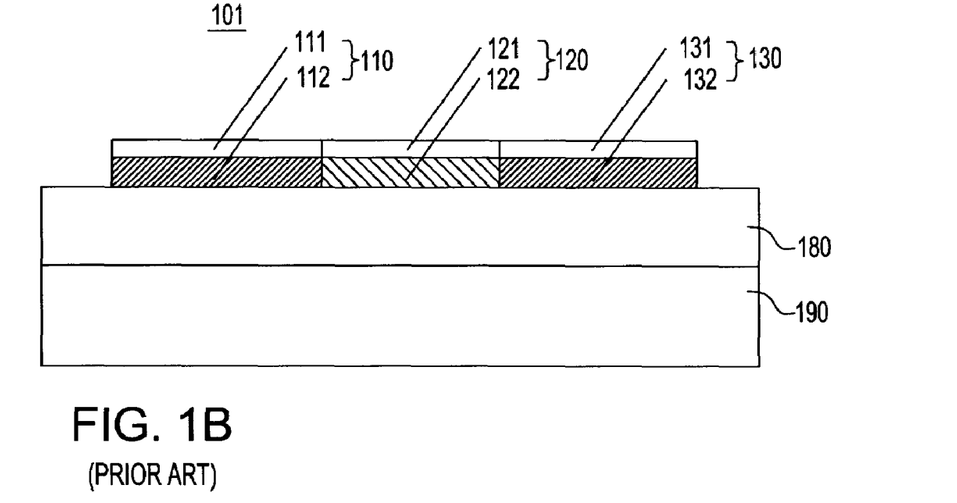
FIG. 1B is a cross-sectional view diagram 101 of an electrically programmable P-doped fuse 100 along the line A-A' in FIG. 1A with the display of underlying layers.

The prior art discloses the use of homogeneous doping in the polysilicon across the cathode, fuselink, and anode. Kothandaraman et al. discloses the use P-doping in the polysilicon. FIG. 1A shows a P-doped electrical fuse 100 according to Kothandaraman et al. FIG. 1B is a cross-sectional view 101 of FIG. 1A along the line A-A' with the display of the underlying layers. The P-doped electrical fuse 100 is built on shallow trench isolation 180, which in turn is built on a silicon substrate 190. The cathode 110 consists of a first P-doped polysilicon region 112 and a first silicide region 111. The fuselink 120 consists of a second P-doped polysilicon region 122 and a second silicide region 121. The anode 130 consists of a third P-doped polysilicon region 132 and a third silicide region 131. Contacts (not shown in figures) are placed on the cathode 110 and on the anode 130 to provide an electrical connection to an external circuitry that provides programming current.

Figure 2A:
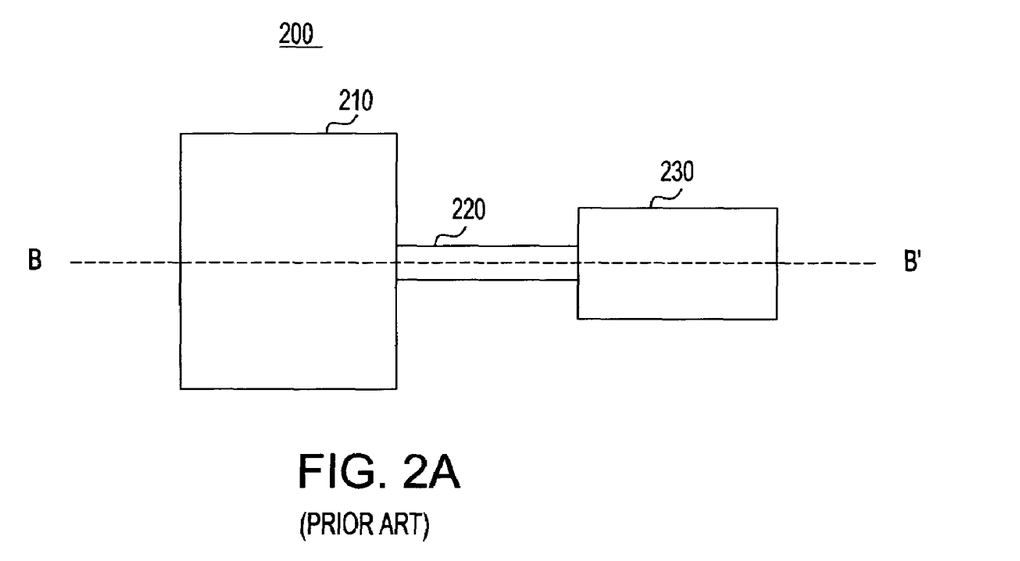
FIG. 2A is a view diagram of an undoped electrical fuse 200.
Figure 2B:
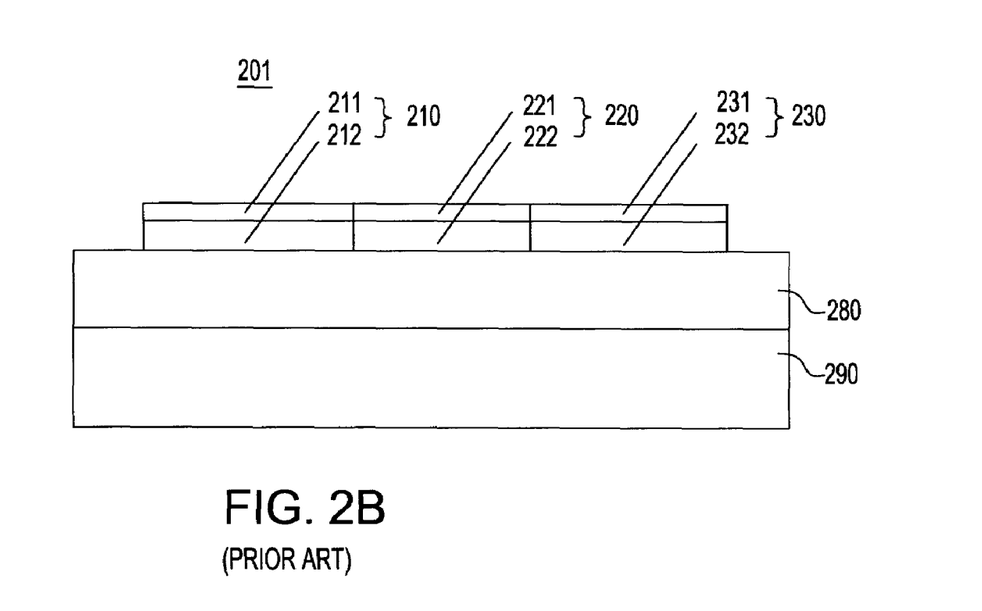
FIG. 2B is a cross-sectional view diagram 201 of an undoped electrical fuse 200 along the line B-B' in FIG. 2A with the display of underlying layers.

The structure of an undoped electrical fuse 200 is shown in FIG. 2A and FIG. 2B, which is a cross-sectional view 201 of FIG. 2A with the display of the underlying layers. The undoped electrical fuse comprises the cathode 210, the fuselink 220, and the anode 230. The undoped electrical fuse 200 is built on shallow trench isolation 280, which in turn is built on a silicon substrate 290. The cathode 210 consists of a first undoped polysilicon region 212 and a first silicide region 211. The fuselink 220 consists of a second undoped polysilicon region 222 and a second silicide region 221. The anode 230 consists of a third undoped polysilicon region 232 and a third silicide region 231. None of the polysilicon regions are hatched in FIG. 2B to show the absence of doping in the polysilicon material.

Figure 3A:
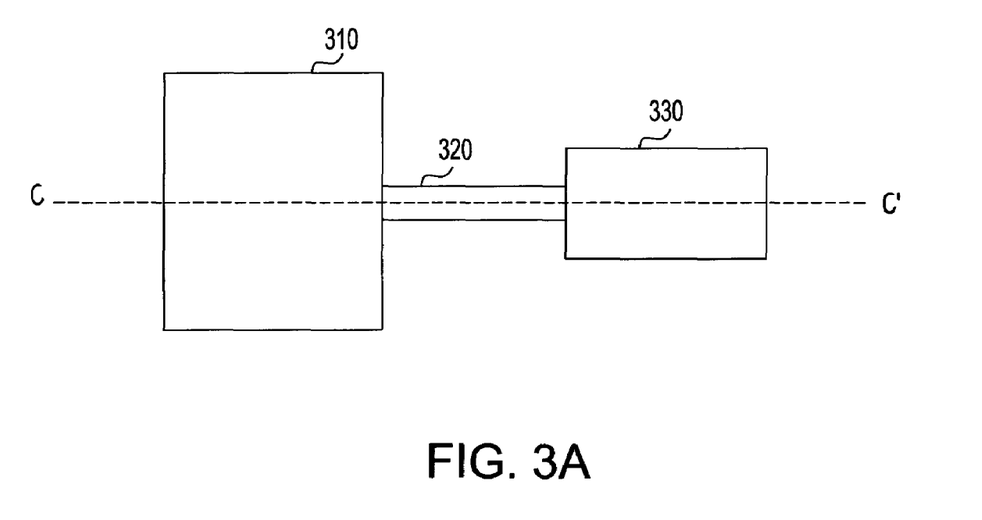
FIG. 3A is a view diagram of a partly doped electrical fuse 300 according to this invention.
Figure 3B:
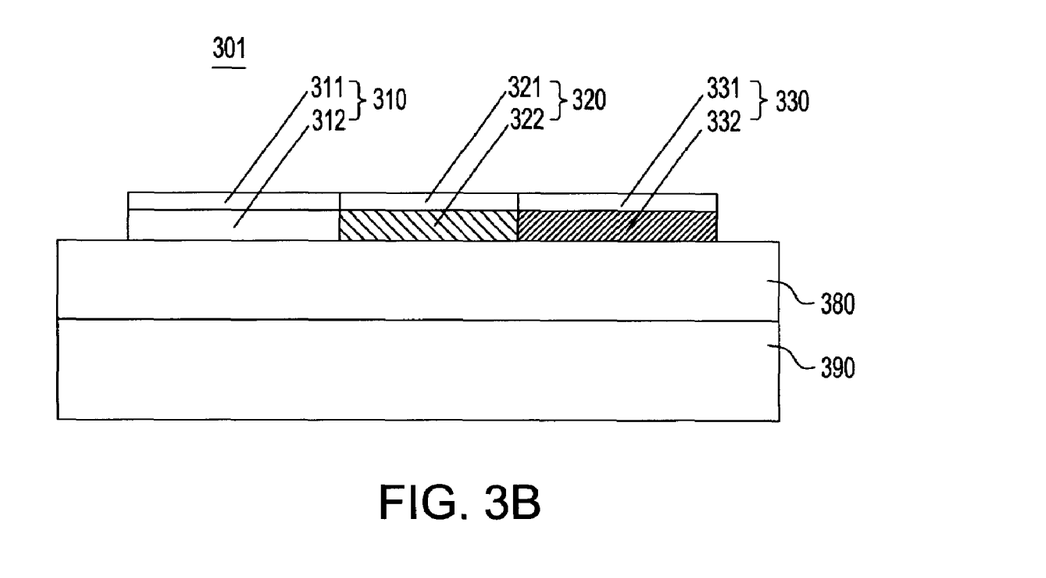
FIG. 3B is a cross-sectional view diagram 301 of a partly doped electrical fuse 300 according to this invention along the line C-C' in FIG. 3A with the display of underlying layers.

According to this invention, a partly doped electrical fuse 300 is disclosed in FIG. 3A and FIG. 3B. FIG. 3A is a top-down view of the partly doped electrical fuse 300. In the view, the partly doped electrical fuse 300 looks identical to the other electrical fuses known in the prior art, such as the P-doped electrical fuses 100 in FIG. 1A or the undoped electrical fuse 200 of FIG. 2A since the placement of silicide on top of the various polysilicon material is the same across these fuses. When the cross-sectional views are compared between FIG. 1B, FIG. 2B, and FIG. 3B, in which all of the P-doped polysilicon regions are hatched and the undoped polysilicon region are not hatched, the differences in the structures become evident.

Examining FIG. 3B in further detail, the partly doped electrical fuse 300 according to this invention is built on shallow trench isolation 380, which in turn is built on a silicon substrate 390. The cathode 310 consists of an undoped semiconducting material region 312 and a first conducting material region 311. The fuselink 320 consists of a first P-doped semiconducting material region 322 and a second conducting material region 321. The anode 330 consists of a second P-doped semiconducting material region 332 and a third conducting material region 331. Contacts (not shown) are placed on the cathode 310 and on the anode 330 to provide an electrical connection to an external circuitry that provides programming current. While FIG. 3B describes a partly doped electrical fuse 300 as it is implemented on a bulk substrate, implementation of a similar fuse on a silicon-on-insulator (SOI) substrate is straightforward.

During the semiconductor processing, a typical electrical fuse is formed at the same time as the gate stack. After a semiconductor substrate is patterned for shallow trench isolation (STI) formation, STI is etched and filled with an insulator. Doping of various parts of the substrate may be performed to optimize the performance of transistors thereafter. A gate stack is formed, which typically comprises a gate dielectric, a gate semiconducting material, and a gate conductor. While an electrical fuse may be formed either on STI or on silicon that is not covered by STI, formation of electrical fuses on STI is generally preferred. Also, while a different semiconducting material may be deposited for electrical fuses than the gate semiconducting material, using the same semiconducting material for both the gate semiconducting material and electrical fuses is preferred. The semiconducting material used for the gate and the electrical fuse may be deposited without doping, that is, as undoped semiconducting material, and then patterned and doped with ion implantation as necessary. The formation of gate conducting material follows. In a preferred embodiment, the gate conducting material is the same as the conducting material used in the electrical fuses. In the most preferred embodiment, the conducting material used for both the gate and the electrical fuses is a silicide material.

The semiconducting material and the conducting material do not need to be the same as the material used in the gate stack as noted above. In an alternate manufacturing process for electrical fuses utilizing the semiconducting material of the substrate itself, the substrate itself provides the semiconducting material. In this case, a portion of the substrate is patterned for electrical fuses surrounded by STI. The semiconducting material within the pattern is doped as necessary. A conducting material is formed on top of the patterned semiconducting material to form an electrical fuse. Preferably, the semiconducting material is a silicide.

As mentioned above, any undoped semiconducting material can be utilized for the undoped semiconducting material region 312 and any P-doped semiconducting material may be used for the first P-doped semiconductor material region 322 and the second P-doped semiconductor material region 332. In a preferred embodiment, undoped polysilicon is utilized for the undoped semiconducting material region 312 and P-doped polysilicon is utilized for the first P-doped semiconductor material region 322 and the second P-doped semiconductor material region 332. In a most preferred embodiment, the thickness of the undoped polysilicon is between 40 nm and 300 nm. Also, preferably, the doping of the P-doped semiconductor material is above $5\times10^{19}/cm^3$ in atomic concentration. Most preferably, the doping of the P-doped semiconductor material is above $3\times10^{20}/cm^3$ in atomic concentration. A commonly used P type dopant in the semiconductor industry is boron (B) but other P-type dopants may also be used.

The use of the semiconducting material in a different structure still preserves the benefit of this invention. For example, the use of amorphous silicon, epitaxial silicon, or single crystalline silicon does not change the invention materially since the electrical fuses heat up to a very high temperature during the process of programming and at such a high temperature, the morphology of the silicon material does not affect electromigration in a significant way. Furthermore, the use of germanium, carbon, or a combination of both into the polysilicon, amorphous silicon, or single crystal silicon still preserves the benefit of this invention since the electrical fuse programming characteristics do not change due to the alloying of silicon with germanium or carbon.

The semiconducting material itself may be chosen from amorphous silicon, epitaxial silicon, single crystal silicon, silicon germanium alloy, silicon carbon alloy, silicon carbon germanium alloy, a III-V compound semiconductor, or a II-VI compound semiconductor. It must be noted however that undoped polysilicon needs to be replaced with an undoped semiconducting material while the P-doped polysilicon needs to be replaced with a P-doped semiconducting material. Rephrasing the above statement, the undoped semiconducting material can be one of the following: undoped amorphous silicon, undoped epitaxial silicon, undoped single crystal silicon, undoped silicon germanium alloy, undoped silicon carbon alloy, undoped silicon carbon germanium alloy, an undoped III-V compound semiconductor, or an undoped II-VI compound semiconductor. Likewise, both the P-doped semiconducting material in the fuselink and the P-doped material in the anode can be one of the following: P-doped amorphous silicon, P-doped epitaxial silicon, P-doped single crystal silicon, P-doped silicon germanium alloy, P-doped silicon carbon alloy, P-doped silicon carbon germanium alloy, a P-doped III-V compound semiconductor, or a P-doped II-VI compound semiconductor.

While any conducting material that may be electromigrated may be used for the first conducting material region 311, for the second conducting material region 321, and for the third conducting material region 332, in a preferred embodiment, a silicide is utilized for each of the regions requiring a conducting material. In a most preferred embodiment, the same silicide material silicide is utilized for all three regions requiring a silicide material.

The variety of silicide most commonly used in the semiconductor industry include nickel silicide ($NiSi_x$), nickel platinum silicide ($NiPt_ySi_x$), cobalt silicide ($CoSi_x$), tantalum silicide ($TaSi_x$), and titanium silicide ($TiSi_x$), with the value of x being in general greater than 2 and the value of y typically being around 0.05. This invention is also compatible with other new types of silicide material that can be electromigrated. Also, other materials with high conductivity such as any metal, for example, Ta, Ti, or W, can effectively replace the silicide as long as that material can be electromigrated to produce a similar final structure as described in this invention. Similarly, a metal nitride such as $TaN_x$, $TiN_x$, or $WN_x$ may replace the silicide as well.

Also, the geometry of the cathode 310 of the partly doped electrical fuse 300 may not be a rectangle as described in FIG. 3A but have some taper built into the two sides of the cathode 310 that abuts the fuselink 320. The taper may be built into the cathode 30 at a positive angle or at a negative angle. An example of an implementation of such a taper is shown in the U.S. Pat. No. 5,969,404 to Bohr et al. An example of an implementation of a taper in the other direction is shown in Tonti et al., "Reliability and Design Qualification of a Sub-micron Tungsten Silicide E-fuse," IEEE 04CH37533 $42^{nd}$ Annual IRPS, April 2004, pp. 152-156.

Figure 3C:
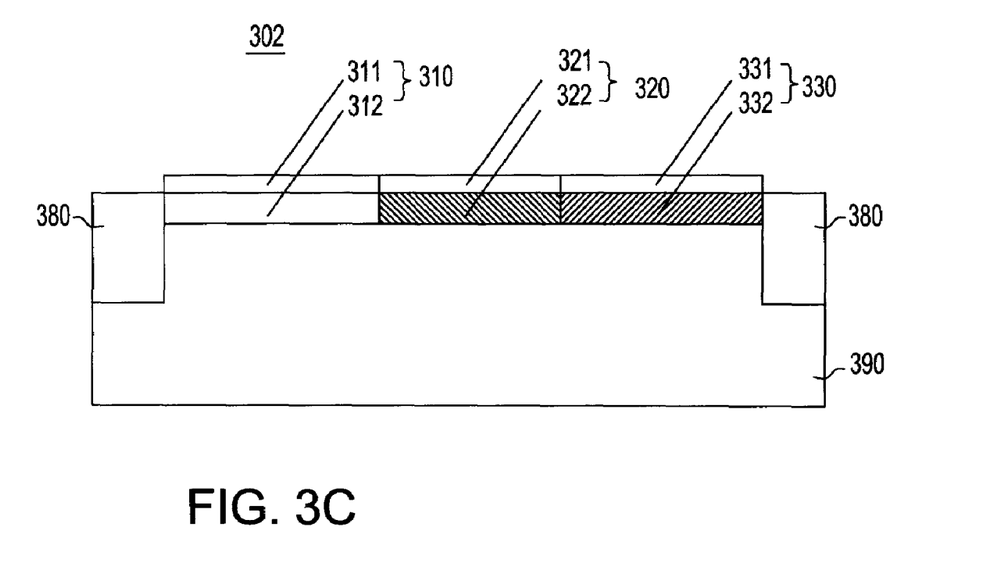
FIG. 3C is a cross-sectional view diagram 302 of an alternate implementation of a partly doped electrical fuse 300 according to this invention along the line C-C' in FIG. 3A with the display of underlying layers.

FIG. 3C discloses an alternate implementation of this invention of a partly doped electrical fuse 300. The cathode 310, the fuselink 320, and the anode 330 are not built on STI. Instead, the single crystalline silicon from the substrate 390 is utilized to build an electrical fuse directly within the substrate. As noted above, since the single crystal silicon may be used instead of polysilicon as long as the doping schemes for each of the components of the electrical fuse match, this type of fuse is still operational given sufficient amount of current to cause electromigration of the conducting material. In this case, the undoped semiconducting material is an undoped single crystalline silicon from the bulk formed within the bulk substrate and abutting the top surface of the same bulk substrate. Similarly, the P-doped semiconducting material is a P-doped single crystalline silicon from the bulk formed within the bulk substrate and abutting the top surface of the same bulk substrate. This structure may be built on a bulk substrate or on a silicon-on-insulator (SOI) substrate. While the invention is described with the structure described in FIGS. 3A and 3B, the invention can be applied to alternate structures as described in FIG. 3C as well.

In general, the effect of changes in the doping in the structure of electrical fuses, while capable of causing major changes on their post-programming resistance, is difficult to predict due to the insufficiency of understanding of the mechanism for electromigration during the programming of electrical fuse. This is illustrated in the example below where the transient responses of the programming current and voltage in the programming circuitry during the process of electrical fuse programming for two different types of fuses are compared. In this particular example, a P-doped electrical fuse according to Kothandaraman et al. and an undoped electrical fuse were compared for their transient programming characteristics. Factors other than doping such as dimensions, silicide material, and voltage bias were identical between these two fuses.

Figure 4:
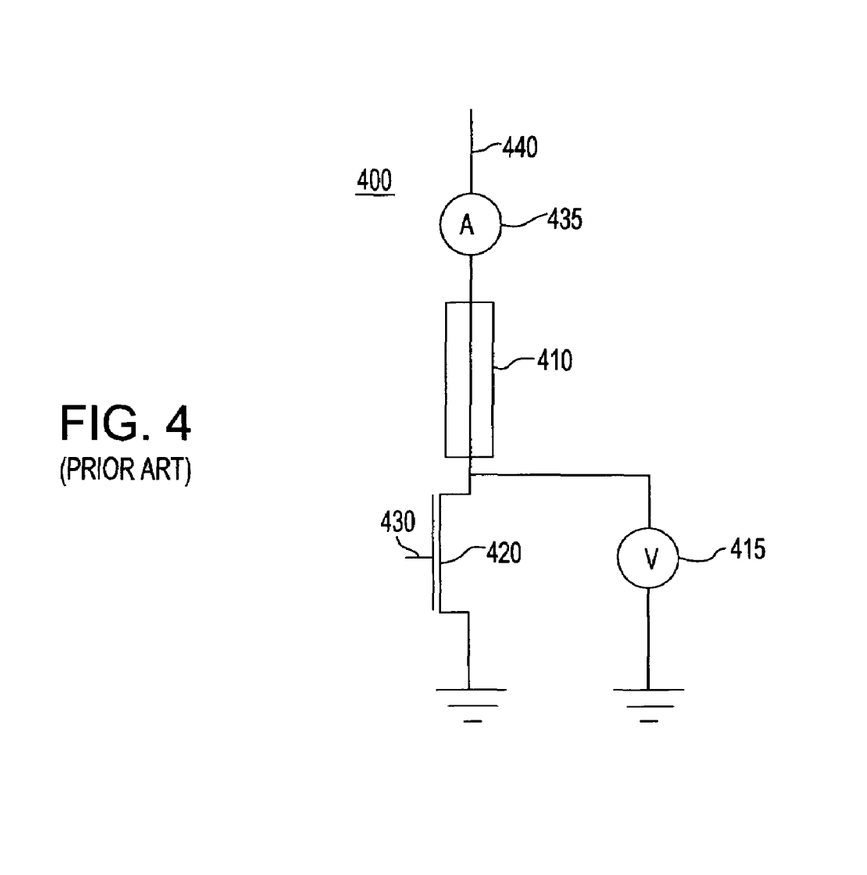
FIG. 4 is a diagram for a typical electrical fuse programming circuitry 400.

FIG. 4 describes a circuit 400 that was used as experimental set up for transient voltage and transient current measurement during the programming of an electrical fuse. The circuit 400 comprises a voltage supply 440, an ammeter 435 connected in series to the voltage supply 440, an electrical fuse 410 connected in series to the ammeter 435, a programming transistor 420 that is grounded on one end and connected in series to the electrical fuse 410 on the other end, a voltage meter connected parallel to the programming transistor 420 between the electrical fuse 410 and the ground, and a switchable voltage supply 430 connected to the gate of the programming transistor 420. When the programming of the electrical fuse 410 was desired, the voltage supply 440 was connected to a positive voltage source and the voltage to the gate 430 of the programming transistor 420 was pulsed to a high voltage to turn on the transistor 420. The voltage on the voltmeter 415 and the current through the ammeter 435 were measured as a function of time. In a first experiment, a P-doped electrical fuse was used for the electrical fuse 410 in the circuit 400. In a second experiment, an undoped electrical fuse was used for the electrical fuse 410 in the circuit 400.

Figure 5:
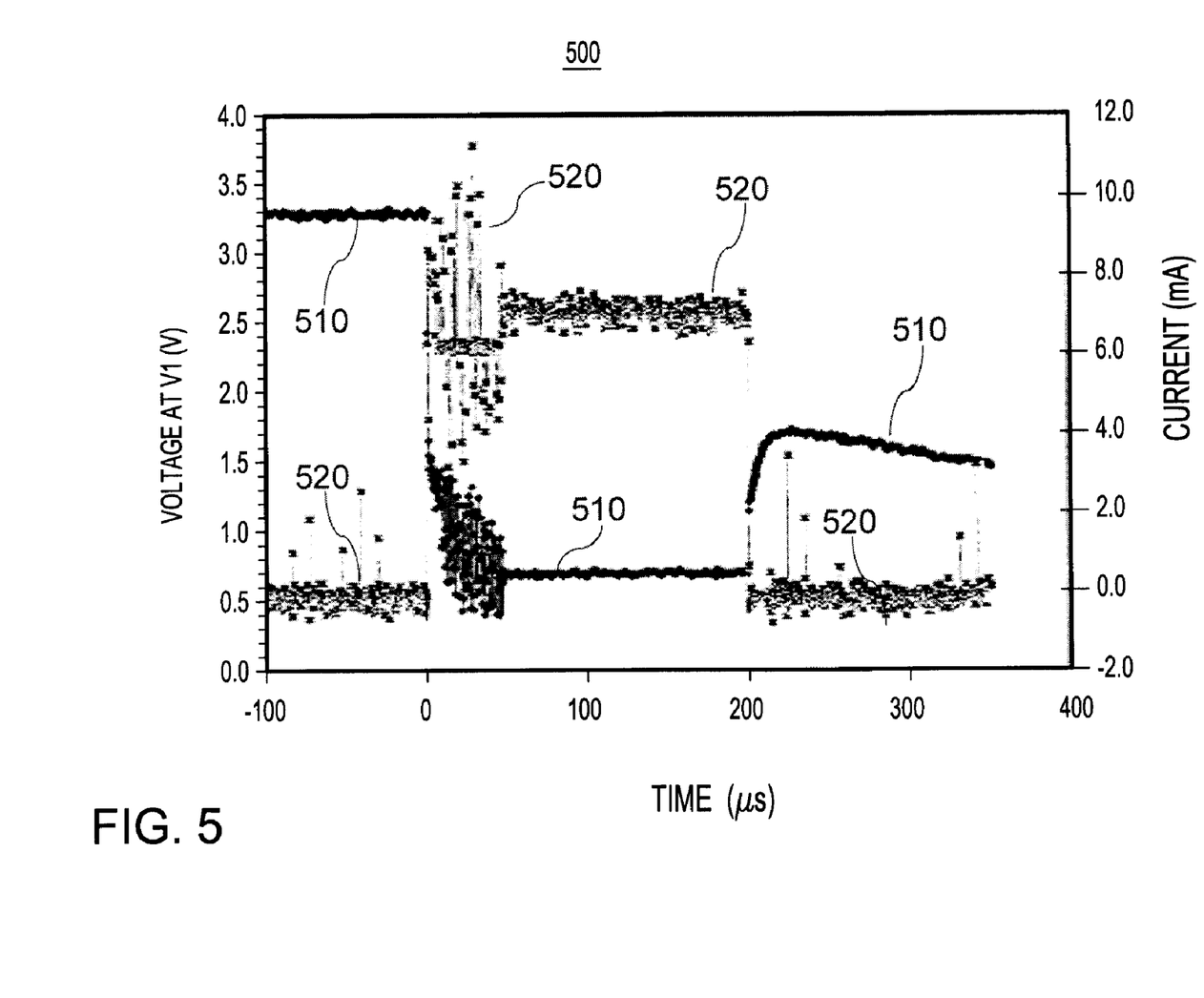
FIG. 5 is a graph 500 of transient voltage and current measurement on a P-doped polysilicon fuse according to Kothandaraman et al.

The graph 500 in FIG. 5 shows a transient voltage plot 510 and a transient current plot 520 for a P-doped electrical fuse that was programmed in the first experiment. The transient voltage plot 510 is the measurement of the voltage across the volt meter 415 in FIG. 4 in this measurement set up. The transient current plot 520 is the measurement of the current through the ammeter 435 in FIG. 4 in the measurement set up.

The horizontal axis of the graph 500 is the time scale with the 0 microsecond notch coinciding with the beginning of the gate pulse and the 200 microsecond notch coinciding with the ending of the pulse. The scale for the transient voltage plot 510 is the y-axis on the left side of the graph 500. The scale for the transient current plot 520 is the y-axis on the right side of the graph 500.

Figure 6:
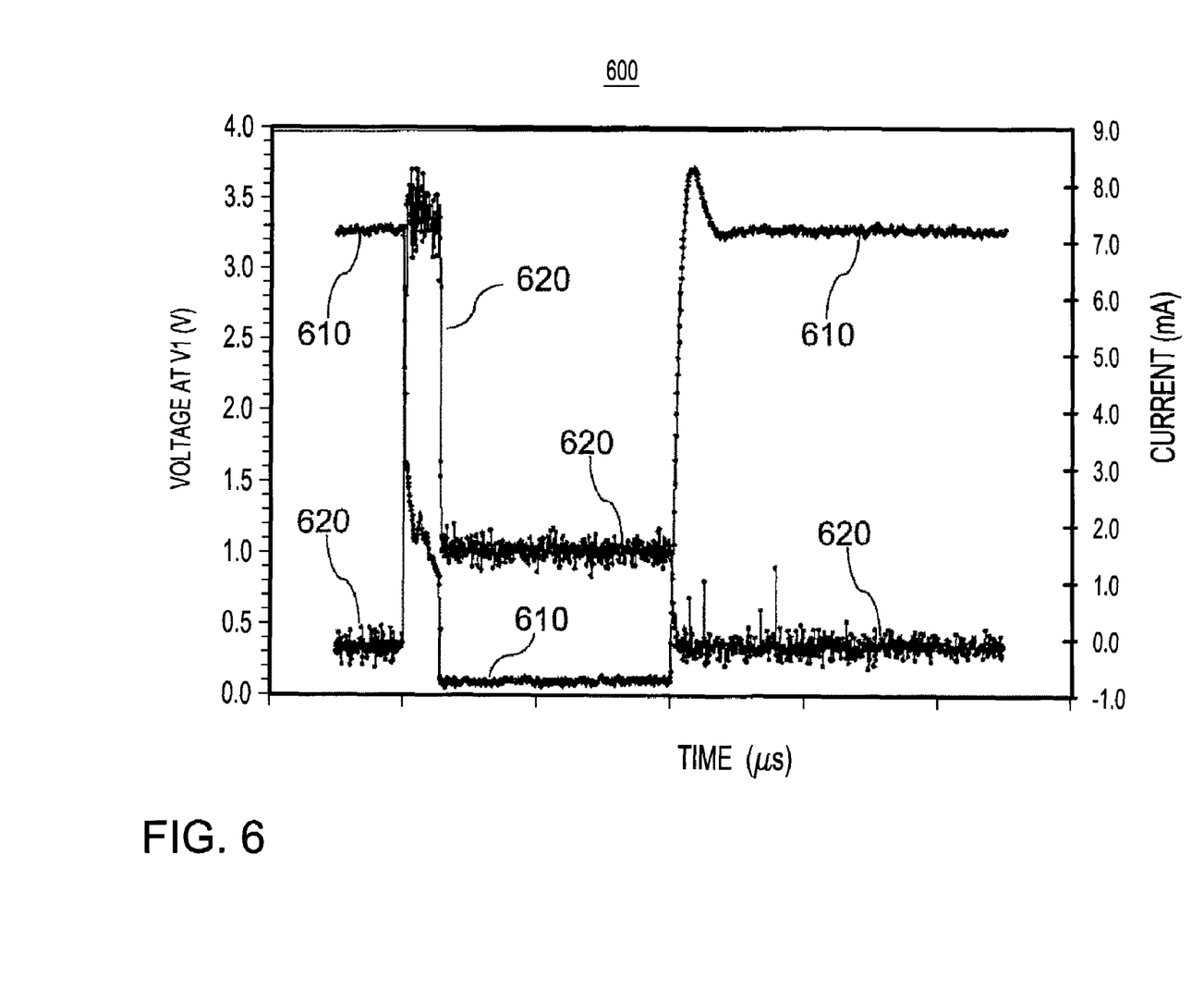
FIG. 6 is a graph 600 of transient voltage and current measurement on an undoped polysilicon fuse.

Likewise, the graph 600 in FIG. 6 shows a transient voltage plot 610 and a transient current plot 620 for an undoped electrical fuse that was programmed in the second experiment. The transient voltage plot 610 is the measurement of the voltage across the volt meter 415 in FIG. 4 in this measurement set up. The transient current plot 620 is the measurement of the current through the ammeter 435 in FIG. 4 in the measurement set up. The horizontal axis of the graph 600 is the time scale with the 0 microsecond notch coinciding with the beginning of the gate pulse and the 200 microsecond notch coinciding with the ending of the pulse. The scale for the transient voltage plot 610 is the y-axis on the left side of the graph 600. The scale for the transient current plot 620 is the y-axis on the right side of the graph 600.

Examination of these two graphs shows major differences between the two transient voltage plots and between the two transient current plots. First, the programming of the P-doped electrical fuse proceeds throughout the 200 microsecond gate pulse cycle with an almost constant programming current throughout the duration of the gate pulse for 200 microseconds. This is reflected in the transient current plot 520 that shows a programming current around 7 mA and in the transient voltage plot 510 that shows a voltage across the programming transistor about or greater than 0.6V throughout the duration of the programming pulse. In contrast, the transient current plot 620 that shows a short current pulse of about 7.5 mA lasting only about 25 microseconds followed by a low current of about 1.5 mA thereafter. Also, the transient voltage plot 610 shows that the voltage across the programming transistor is about 1.0V during the first 25 microseconds or so and then dropping to only about 0.1V, confirming the observation drawn from the transient current plot 620. Therefore, the duration and the magnitude of the programming current change significantly depending on the structure, particularly, the doping of the electrical fuses.

Furthermore, the state of electrical fuses after the end of the voltage pulse on the gate 430 of the programming transistor 420 is substantially different between the two electrical fuses. Immediately after programming, that is, immediately after the 200 microsecond notch in the two graphs, the voltage drop across the programming transistor 420 reflects the resistance of the electrical fuse 410 at that point in time. The transient current plot 520 in graph 500 shows that the resistance of the programmed P-doped electrical fuse immediately after the end of the programming pulse is on par with the inverse of the transconductance of the programming transistor 420 and changes gradually. However, the corresponding transient current plot 620 in graph 600 shows that the resistance of the programmed undoped electrical fuse immediately after the end of the programming pulse is lower than the inverse of the transconductance of the programming transistor 420. The transient post programming resistance behavior immediately after programming is therefore significantly affected by the doping of the electrical fuses.

Current theories on electromigration have not been able to predict this type of response. Therefore, experimental verification of post-programming resistance distribution is necessary to ascertain the superiority of programming characteristics of improved electrical fuses.

Since any improvement in the post-programming fuse resistance distribution of the partly doped electrical fuse 300 cannot be deduced from existing theories, it was necessary to compare the performance of a substantial sample size of partly doped electrical fuses with the performance of electrical fuses of similar sample size known in the prior art. To generate this data, four types of electrical fuses were designed and placed in an array of a test chip. The array contained about 1000 fuses of each type. The test chips were manufactured in volume and each type of electrical fuses were programmed.

| Statistics | First type of fuse (P-doped electrical fuse) | Third type of fuse (partly doped electrical fuse) |
|---|---|---|
| Logarithm of the median of the post-programming resistance | 4.19 | 5.82 |
| Logarithm of the 10 percentile of the post-programming resistance | 3.83 | 4.26 |
| Logarithm of the 5 percentile of the post-programming resistance | 3.74 | 3.99 |

The data from Table 1 shows that fuses of the third type, that is, the partly doped electrical fuses according to the invention, statistically yields higher values for the programming resistance compared to fuses of the first type that is known in the prior art.

Figure 9:
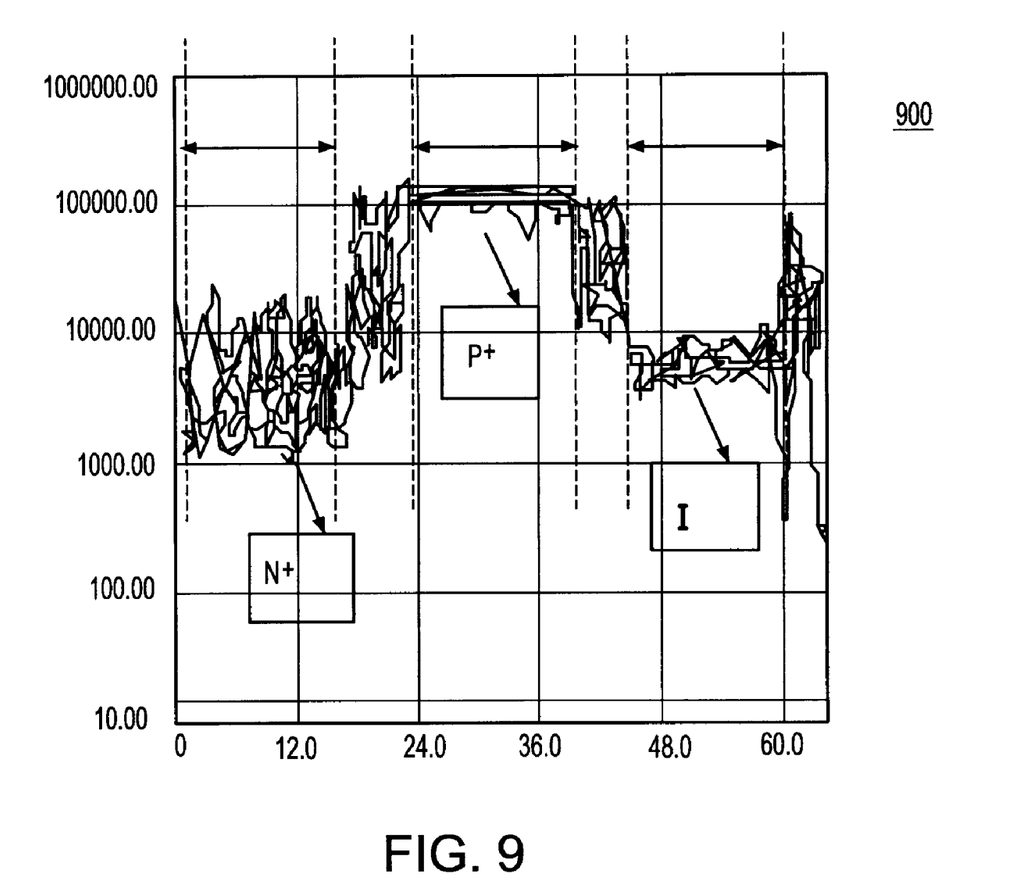
FIG. 9 is a graph 900 comparing the post-programming resistance of three types of electrical fuse, which are N-doped polysilicon fuses, fuses according to this invention, and undoped polysilicon fuses.

Comparison of post-programming resistance distribution between fuses of the third type, fuses of the second type, and fuses of the fourth type is shown in a graph 900 in FIG. 9. The three types of fuses were placed in the same array in the same test chip to eliminate the effect of process variations from different lots or wafers. The x-axis represents the identification number, or a "fuse number", for each fuse within the array. Fuse numbers 1-16 corresponds to fuses of the fourth type, which are also marked with the symbol, N+. Fuse numbers 24-40 corresponds to fuses of the third type, which are also marked with the symbol, P+. Fuse numbers 45-60 corresponds to fuses of the fourth type, which are also marked with the symbol, I. Even from a relatively small sample size of about 160 fuses of each type in the graph 900, it is evident that both fuses of the second type and fourth type of fuses produce a significant portion of post-programming resistance values below 10,000 Ohms while fuses of the third type, which is the partly doped electrical fuse according to this invention does not produce. Obviously, the fuses of the third type are much superior to both fuses of the second type and fuses of the fourth type.

The first type was a P-doped electrical fuse according to Kothandaraman et al. All the polysilicon material in the P-doped electrical fuse, that is, the polysilicon material across the cathode, fuselink, and anode, was doped with P-type dopants. The structure of the P-doped electrical fuse was the same as the P-doped electrical fuse 100 described in FIGS. 1A and 1B.

The second type was an undoped electrical fuse known in the prior art. All the polysilicon material in the undoped electrical fuse, that is, the polysilicon material across the cathode, fuselink, and anode, was not doped. The structure of the undoped electrical fuse was the same as the undoped electrical fuse 200 described in FIGS. 2A and 2B.

The third type was a partly doped electrical fuse according to this invention. The polysilicon material in the cathode of the partly doped electrical fuse was not doped. The polysilicon material in the fuselink and the anode of the partly doped electrical fuse was doped with P-type dopants. The structure of the partly doped electrical fuse was the same as the partly doped electrical fuse 300 described in FIGS. 3A and 3B.

The fourth type was an N-doped electrical fuse known in the prior art. All the polysilicon material in the N-doped electrical fuse, that is, the polysilicon material across the cathode, fuselink, and anode, was doped with N-type dopants.

The geometry of these four types of fuses were identical, that is, the dimensions of these fuses were identical and chosen to reflect the trend in the industry for lower programming supply voltage compared to fuse dimensions known in the industry presently. Specifically, while the currently prevailing dimensions for the fuselink are a length about 1.20 microns and a width about 0.093 microns, the fuselink dimensions for the four type of fuses are a length about 0.80 microns and a width about 0.063 microns. Since each type of fuse was placed within the same array design as mentioned above, the only difference among the fuses was the doping of the various portions of polysilicon layers in the structure.

Figure 7:
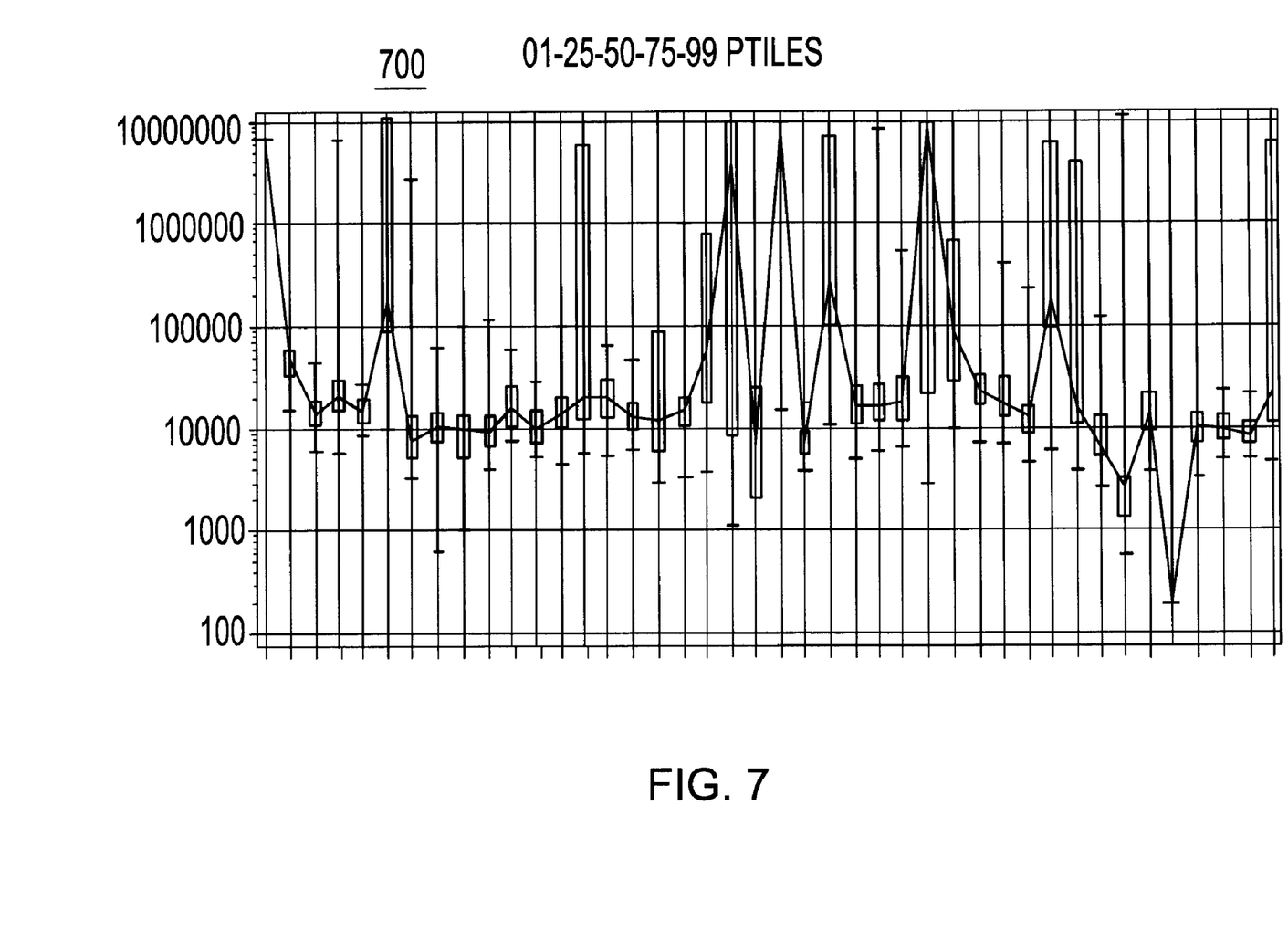
FIG. 7 is a trend chart 700 for post-programming resistance distribution of the P-doped electrical fuses manufactured according to Kothandaraman et al. on 42 lots of semiconductor wafers.

The resistance distribution of the first type of electrical fuses was plotted in a trend chart 700 in FIG. 7. Each notch on the x-axis represents a "lot" of semiconductor wafers, which typically ranges between 5 and 25 semiconductor wafers. Each wafer contained multiple test chips of identical design, a typical number for the test chips on a given wafer being about 50 to 500. Each test chip contained an array of electrical fuses comprising the four types of fuses mentioned above. The y-axis represents the post-programming fuse resistance values in Ohms in a log scale. Data from each lot was plotted as a box plot with a line in the middle of the box, which represents the median of the post-programming resistance distribution for that lot for the fuses of the first type. The top of each box represents the 75 percentile mark, the bottom of each box represents the 25 percentile mark, the bar above and outside of each box represents the 99 percentile mark, and the bar below and outside of each box represents the 1 percentile mark of the post-programming fuse resistance distribution, where the percentile measurement is measured from the lowest value of the distribution.

Figure 8:
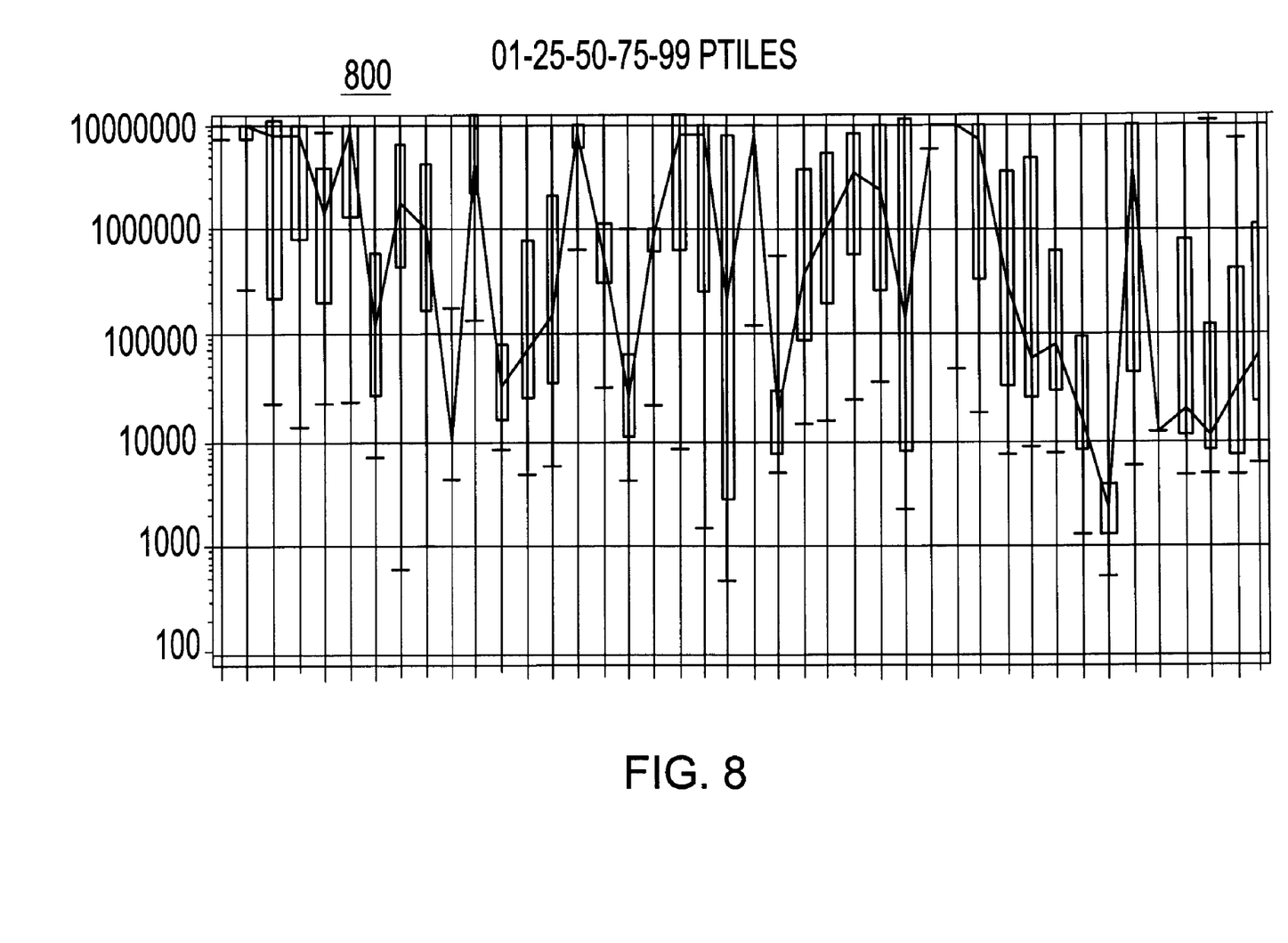
FIG. 8 is a trend chart 800 for post-programming resistance distribution of partly doped electrical fuses according to the present invention from 42 lots of semiconductor wafers.

The resistance distribution of the third type of electrical fuses was plotted in a trend chart 800 in FIG. 8. Data for the third type of electrical fuses are from the same array within the same test chip as the data for the first type of electrical fuses in the trend chart 700 in FIG. 7. The format of the data is also the same as in FIG. 7. Data in the two trend charts in FIGS. 7-8 represent the post-programming resistance distribution of these two types of fuses with significant variations in the manufacturing process. The sample size of about 15,000 electrical fuses in each trend chart was sufficiently large to determine the statistical distribution of the post-programming resistance.

Results of further statistical analysis on the logarithm with base 10 of some percentile values of the entire population of post-programming resistance, that is, all the data plotted in each trend chart, of the first type of fuse and the third type of fuse are tabulated in table 1 below:

Table 1. Comparison of statistics on post-programming resistance distribution of fuses of the first type and fuses of the third type The collective body of evidence as captured in the trend chart 700 in FIG. 7, the trend chart 800 in FIG. 8, and the graph 900 in FIG. 9 establish that the fuses of the third type produces better post-programming fuse resistance distribution than the fuses known in the prior art.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising a fuselink laterally and directly abutting a cathode and an anode, wherein said fuselink has a first constant width throughout, said cathode has a second constant width, said anode has a third constant width, said first width is less than said second width and is less than said third width in a top view, and said cathode includes an undoped semiconducting material region and a first conducting material region; wherein said fuselink includes a first P-doped semiconducting material region and a second conducting material region, said first P-doped semiconductor material region in said fuselink laterally and directly contacts said undoped semiconducting material region in said cathode at an interface between said fuselink and said cathode, and said second conducting material region laterally and directly contacts said first conducting material region; and wherein said anode includes a second P-doped semiconducting material region and a third conducting material region, wherein said second P-doped semiconducting material region laterally and directly contacts said first P-doped semiconducting material region, and said third conducting material region laterally and directly contacts the second conducting material region.

2. The semiconductor structure of claim 1, wherein an interface between an undoped semiconducting material and a P-doped semiconducting material within said semiconductor structure exists only at a boundary between said cathode and said fuselink.

3. The semiconductor structure of claim 1, wherein an interface between an undoped semiconductor material and a doped semiconductor material within said semiconductor structure exists only at a boundary between said cathode and said fuselink.

4. The semiconductor structure of claim 3, wherein said fuselink consists of said first P-doped semiconducting material region and said second conducting material region.

5. The semiconductor structure of claim 4, wherein said cathode consists of said undoped semiconducting material region and said first conducting material region, and said anode consists of said second P-doped semiconducting material region and a third conducting material region.

6. The semiconductor structure of claim 1, wherein said undoped semiconducting material region comprises a semiconductor material that is selected from the group consisting of:

undoped amorphous silicon, undoped epitaxial silicon, undoped single crystal silicon, undoped silicon germanium alloy, undoped silicon carbon alloy, undoped silicon carbon germanium alloy, undoped III-V compound semiconductor, and undoped II-VI compound semiconductor.

7. The semiconductor structure of claim 1, wherein each of said first P-doped semiconducting material region and said second P-doped semiconducting material region comprises a material that is selected from the group consisting of:

P-doped amorphous silicon, P-doped epitaxial silicon, P-doped single crystal silicon, P-doped silicon germanium alloy, P-doped silicon carbon alloy, P-doped silicon carbon germanium alloy, P-doped III-V compound semiconductor, and P-doped II-VI compound semiconductor.

8. The semiconductor structure of claim 7, wherein said first P-doped semiconducting material region and said second P-doped semiconducting material region comprise a same material.

9. The semiconductor structure of claim 1, wherein each of said first conducting material region, said second conducting material region, and said third conducting material region comprise a material selected from the group consisting of:
a silicide, a metal, a metal germanide, and a conducting metal nitride.

10. The semiconductor structure of claim 9, wherein said first conducting material region, said second conducting material region, and said third conducting material region comprise a same material.

11. The semiconductor structure of claim 10, wherein each of said first conducting material region, said second conducting material region, and said third conducting material region comprise a same silicide.

12. A semiconductor structure of claim 10, wherein said first P-doped semiconducting material region and said second P-doped semiconducting material region comprise a same P-doped semiconductor material.

13. The semiconductor structure of claim 12, wherein said same P-doped semiconductor material differs in composition from an undoped semiconductor material in said undoped semiconducting material only by the presence of P-type dopants.

14. The semiconductor structure of claim 13, wherein said undoped semiconducting material is undoped polysilicon and said same P-doped semiconductor material is P-doped polysilicon.

15. The semiconductor structure of claim 1, wherein said cathode is substantially rectangular and said anode is substantially rectangular, and said cathode has a second constant width throughout and said anode has a third constant width throughout.

16. The semiconductor structure of claim 1, wherein said undoped semiconducting material region, said first P-doped semiconducting material region, and said second P-doped semiconducting material region are located directly on a top surface of a shallow trench isolation (STI) that is located within a semiconductor substrate.

17. The semiconductor structure of claim 1, wherein said undoped semiconducting material region, said fuselink including a first P-doped semiconducting material region, and said second P-doped semiconducting material region are single crystalline, and each material region is located within a semiconductor substrate, wherein a shallow trench isolation that is located within said semiconductor substrate laterally contacts said undoped semiconducting material region and said second P-doped semiconducting material region.

18. The semiconductor structure of claim 1, wherein said second P-doped semiconducting material region laterally and directly contacts said first P-doped semiconducting material region at an interface between said fuselink and said anode.

19. The semiconductor structure of claim 18, wherein said cathode consists of, from bottom to top, a stack of said undoped semiconducting material region and said first conducting material region, said fuselink consists of, from bottom to top a stack of, said first P-doped semiconducting material region and said second conducting material region, and said anode consists of from bottom to top, a stack of said second P-doped semiconducting material region and said third conducting material region.

20. The semiconductor structure of claim 19, wherein said undoped semiconducting material region, said first P-doped semiconducting material region, and second P-doped semiconducting material region comprise a same semiconductor material, wherein said undoped semiconducting material region differs from said first P-doped semiconducting material region and said second P-doped semiconducting material region only by doping, and wherein said first conducting material region, said second conducting material region, and said third conducting material region comprise a same silicide material.

* * * * *